United States Patent

Tseng et al.

Patent Number: 5,552,332
Date of Patent: Sep. 3, 1996

[54] PROCESS FOR FABRICATING A MOSFET DEVICE HAVING REDUCED REVERSE SHORT CHANNEL EFFECTS

[75] Inventors: Hsing-Huang Tseng; Philip J. Tobin; Paul G. Y. Tsui; Shih W. Sun; Stephen S. Poon, all of Austin, Tex.

[73] Assignee: Motorola, Inc., Schaumburg, Ill.

[21] Appl. No.: 460,339

[22] Filed: Jun. 2, 1995

[51] Int. Cl.⁶ .......................... H01L 21/265; H01L 21/02
[52] U.S. Cl. .................... 437/41; 437/241; 437/240
[58] Field of Search ................................ 437/241, 239, 437/240, 238, 41 R, 40 R; 148/DIG. 112, DIG. 114

[56] References Cited

U.S. PATENT DOCUMENTS

| | | | |
|---|---|---|---|
| 5,397,720 | 3/1995 | Kwong et al. | 148/DIG. 112 |
| 5,407,870 | 4/1995 | Okada et al. | 437/241 |
| 5,460,992 | 10/1995 | Hasegawa | 148/DIG. 114 |

OTHER PUBLICATIONS

Paul G. Y. Tsui et al., "Suppression of MOSFET Reverse Short Channel Effect by N20 Gate Poly Reoxidation Process", 1994 IEDM San Francisco, California, Dec. 11–14, pp. 501–504.

S. Kusunold et al., "Hot–Carrier–Resistant Structure by Re–oxidized Nitrided Oxide Sidewall for Highly Reliable and High Performance LDD MOSFETS", 1991 IEEE, pp. 25.4.1–25.4.4.

Primary Examiner—Mary Wilczewski
Assistant Examiner—Brian K. Dutton
Attorney, Agent, or Firm—Jasper W. Dockrey

[57] ABSTRACT

A process for the fabrication of an MOSFET device includes the formation of a buffer layer (28) overlying the surface of a semiconductor substrate (14) adjacent to a gate electrode (18). A defect compensating species is diffused through the buffer layer (28) and through a gate dielectric layer (12) to form a defect-compensating region (30) at the surface (14) of the semiconductor substrate (10). The defect-compensating region (30) in conjunction with the buffer layer (28) minimize and control the population of point defects in the channel region (22) of the semiconductor substrate (10). By controlling the population of point defects in the channel region (22), a substantially uniform doping profile is maintained in a shallow doped region (16) formed in the semiconductor substrate (10) at the substrate surface (14). The maintenance of a uniform doping profile in the shallow doped region (16) results in improved threshold voltage stability as the lateral dimension of the channel region (22) is reduced.

19 Claims, 2 Drawing Sheets

PROCESS FOR FABRICATING A MOSFET DEVICE HAVING REDUCED REVERSE SHORT CHANNEL EFFECTS

RELATED APPLICATIONS

Related subject matter is disclosed in a co-pending, commonly assigned patent application having Ser. No. 08/109,896, filed Aug. 23, 1993.

1. Field of the Invention

This invention relates, in general, to a process for fabricating a semiconductor device, and more particularly, to a method for controlling reverse short channel effects in an MOSFET device.

2. Background of the Invention

As transistor devices are fabricated to smaller and smaller dimensions, it becomes increasingly important to maintain precise control of the operational parameters of the transistor. Of particular importance is the control of the threshold voltage of a metal-oxide-semiconductor-field-effect-transistor (MOSFET) as the channel length of the transistor is fabricated to smaller and smaller dimensions. The threshold voltage of an MOSFET is a key parameter, which establishes the point at which the transistor turns on and off under a voltage applied to the gate electrode of the transistor. The failure to maintain control of the threshold voltage can cause many different types of errors to occur in an integrated circuit incorporating the transistor. For example, efficient input of data into a static-random-access-memory (SRAM) device depends upon the ability of the MOSFETs in each SRAM memory cell to switch on and off at precisely determined voltage levels. Additionally, timing problems can develop in an integrated circuit as a result of a variance in the threshold voltage of certain transistors responsible for signal processing in the integrated circuit.

When MOSFETs are fabricated to have channel lengths below one micron, additional processing steps are often necessary to avoid threshold voltage instability. For example, source drain extension regions are formed in the substrate adjacent to the edges of the gate electrode to prevent hot carrier injection into the gate dielectric layer. The additional charge in the gate dielectric layer can cause a shift in the threshold voltage of the MOSFET. Additional control of threshold voltage is obtained by implanting dopants into the substrate near the surface to form a shallow doped region. The shallow doped region modulates the surface potential of the substrate and is commonly used to set the threshold voltage of the transistor. The shallow doped region becomes the channel region of the MOSFET after the formation of a gate dielectric layer, a gate electrode, and source and drain regions.

Once a threshold adjust implant is performed, any subsequent changes in the doping concentration at the substrate surface will be reflected in a change in the threshold voltage of the MOSFET. Therefore, to maintain a precise threshold voltage in an MOSFET it is important to avoid changes in the doping concentration within the channel region of the transistor. For example, in an n-channel transistor, if boron dopant diffuses into the channel region of the device, the threshold voltage will increase. This phenomenon is known as a reverse short channel effect. Conventional thermal processing steps, such as polysilicon gate reoxidation, source-drain formation, and silicidation processes have been identified to be responsible for localized dopant diffusion into the channel regions of MOSFET devices.

The impact of the localized dopant diffusion is especially severe in MOSFETs having a channel length of less than one micron. The generation of point defects, such as super-saturated silicon interstitials, during thermal processing is believed to cause the redistribution of dopant atoms within the channel region of the device. The interstitial population is particularly large at the edges of the channel region near the source drain junctions. In this area, high stress is created during the oxidation of the silicon substrate. To minimize the formation of the super saturated silicon interstitials, submicron MOSFET devices have been fabricated using nitrous oxide during the polysilicon reoxidation process. During the polysilicon reoxidation process, nitrogen diffuses to the substrate and suppresses the formation of the interstitials at the edges of the channel region. A nitrous oxide reoxidation process is described in "Suppression of MOSFET Reverse Short Channel Effect by $N_2O$ Gate Polyreoxidation Process," Tsui, et al., IEDM, San Francisco, Calif., Dec. 11–14, 1994, p. 501.

Although the nitrous oxide reoxidation process is an improvement over conventional processing, the formation of point defects is a pervasive problem and is believed to directly influence the diffusion of dopant in the channel region of an MOSFET. Control of localized diffusion in sub-micron devices is critical because even a small shift in the threshold voltage of a sub-micron transistor can cause severe performance degradation. Accordingly, further development work is necessary to reduce the formation of point defects, such as super-saturated interstitials in the channel region of submicron MOSFET devices, and to further reduce the reverse short channel effect.

SUMMARY OF THE INVENTION

In practicing the present invention there is provided a process for fabricating a semiconductor device in which reverse short channel effects are minimized through the formation of a defect compensating region at the substrate surface, and a buffer layer overlying the substrate, which absorbs point defects from the substrate. In one embodiment of the invention, a substrate is provided having a gate dielectric layer thereon. A gate electrode is formed on the gate dielectric layer and a buffer layer is deposited to overlie the gate electrode and the gate dielectric layer. A buffer layer is deposited to overlie the gate electrode and the gate dielectric layer. The substrate is then subjected to a defect compensating species and the species or a portion thereof is diffused through the buffer layer and the gate dielectric layer to form a nitrogen-rich region between the substrate and the gate dielectric layer. MOSFET devices fabricated in accordance with the invention exhibit a reduced reverse short channel effect when compared with devices fabricated in accordance with the prior art. The reduced reverse short channel effect is believed to relate to the control of the point defect population in the near the edge of the channel region of an MOSFET device fabricated in accordance with the invention.

DETAILED DESCRIPTION OF PREFERRED EMBODIMENTS

The present invention provides a process for fabricating an MOSFET device which reduces the susceptibility of the device to reverse short channel effects in devices having a channel length of less than one micron. To reduce the reverse short channel effects, the formation of point defects in the semiconductor substrate during thermal processing is minimized. Additionally, point defects which are formed in the substrate near the edges of the gate electrode are absorbed by a buffer layer deposited to overlie the gate electrode in the substrate surface. By reducing the formation of point defects in the substrate in the vicinity of a gate electrode, diffusion of dopants into the channel region of the MOSFET device is reduced. As used herein, the term "point defect" is intended to include single atom defects, such as vacancies, interstitials, and the like, and multiple atom defects, such as Frenkel pairs, and the like.

The ability to establish and maintain a uniform dopant concentration in the channel region forestalls the onset of reverse short channel effects as the channel length is reduced. The advantages of the inventive process will be more fully understood following a description of an exemplary process illustrating the reduction of point defects in the substrate during the fabrication of an MOSFET device.

Figure 1:
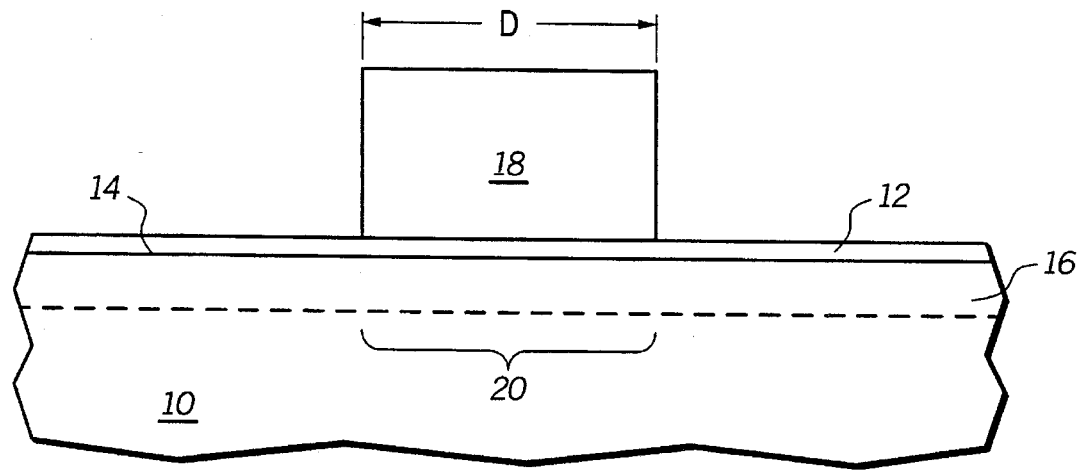
FIGS. 1–4 illustrate, in cross-section, process steps in accordance with the invention.

FIG. 1 illustrates, in cross-section, a portion of a semiconductor substrate 10 having already undergone several steps in accordance with the invention. A gate dielectric layer 12 overlies a surface 14 of semiconductor substrate 10. Preferably, gate dielectric layer 12 is formed by a thermal oxidation process in which a silicon dioxide layer is formed to a thickness of about 50 to 100 angstroms.

Prior to forming gate dielectric layer 12, a sacrificial oxide layer is formed on semiconductor substrate 10, and an ion implantation process is carried out to form a shallow doped region 16 in semiconductor substrate 10. Shallow doped region 16 serves to define the electrical potential of substrate surface 14 and the electrical conductivity in a shallow region of semiconductor substrate 10 below substrate surface 14. The particular dopant species and dopant concentration in region 16 will be determined by the conductivity-type of the MOSFET device being fabricated, and by the desired threshold voltage of the MOSFET device. For purposes of illustrating the process of the present invention, an n-type MOSFET device will be described. In the case of an n-type device, semiconductor substrate 10 preferably has a p-type dopant concentration sufficient to yield a resistivity of about 14 to 22 ohm-cm. Preferably, shallow doped region 16 is formed by ion implanting a p-type dopant, such as boron, using an implantation dose of about $2.0E12$ to $5.0E12$ ions/$cm^2$ at an implant energy of about 10 to 30 keV.

The ion implantation process introduces a uniform distribution of boron atoms into semiconductor substrate 10. Following a thermal annealing step, the boron atoms are activated in semiconductor 10 and create a uniform surface potential across substrate surface 14. A particular advantage of the present invention includes the preservation of the uniform boron concentration in shallow doped region 16 following the subsequent thermal processing used to complete the fabrication of an MOSFET device. Those skilled in the art will, of course, recognize that a P-channel MOSFET device can also be fabricated by reversing the conductivity of dopants in semiconductor substrate 10. The advantages of the present invention can be equally realized in the fabrication of a p-type MOSFET device and the fabrication of such devices is contemplated in the present invention.

The inventive process continues with the formation of a gate electrode 18 overlying gate dielectric layer 12. Preferably, gate electrode 18 is fabricated by depositing a layer of polycrystalline silicon to a thickness of about 2,000 to 3,000 angstroms. The polycrystalline silicon is doped to have an n-type conductivity. The doping process can be carried out either at the time of polycrystalline silicon deposition, using an insitu doping process, or immediately afterward. The polycrystalline silicon can be doped after deposition by implanting an n-type dopant such as Phosphorus or arsenic following deposition of the polycrystalline silicon. In addition to polycrystalline silicon, gate electrode 18 can also be fabricated using refractory metals in combination with polycrystalline silicon. For example, gate electrode 18 can be fabricated with a refractory metal silicide, such as tungsten silicide, titanium silicide, cobalt silicide, and the like.

The placement of gate electrode 18 on semiconductor substrate 10 defines a channel region 20 in semiconductor substrate 10 below gate electrode 18. Channel region 20 includes a portion of shallow doped region 16 residing immediately below gate electrode 18. The lateral dimension of gate electrode 18 is denoted as D in FIG. 1. The preservation of the uniform distribution of boron dopants in channel region 20 is important in stabilizing the threshold voltage of an MOSFET device as the lateral dimension D of gate electrode 18 is reduced.

Figure 2:
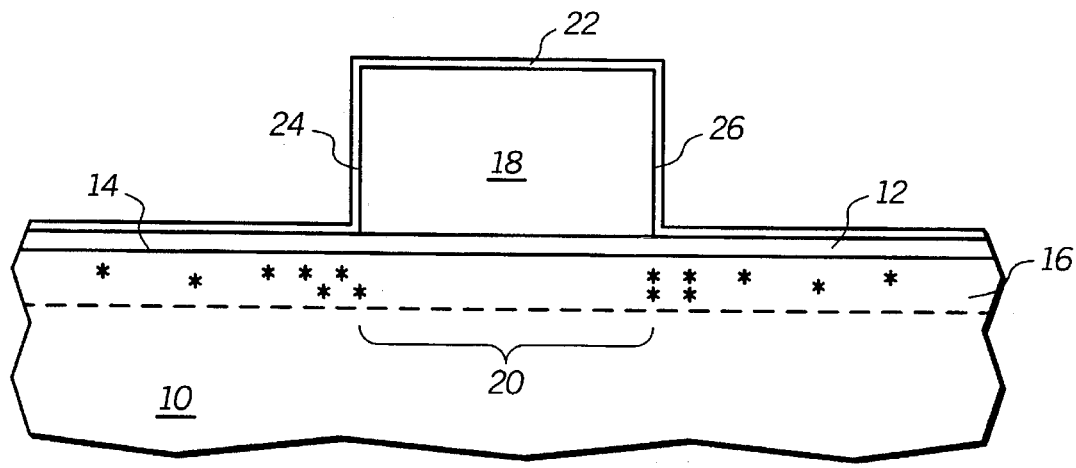

After forming gate electrode 18, in one embodiment of the invention, a poly-reoxidation layer 22 can be formed, as illustrated in FIG. 2. Poly-reoxidation layer 22 is preferably formed by subjecting semiconductor substrate 10 to a thermal oxidation process in which a thin layer of silicon dioxide is formed on the exposed surface of gate electrode 18. Additionally, a thin layer of silicon dioxide also forms on the exposed surface of gate dielectric layer 12.

Although the formation of a poly-reoxidation layer, such as poly-reoxidation layer 22, is an optional step in the process of the present invention, the reoxidation process serves to illustrate the formation of point defects in semiconductor substrate 10 during device processing. Although not wishing to have their invention limited to any particular theory, the inventors believe that during the reoxidation process, the thermal oxidation of substrate surface 14 creates mechanical stress between gate dielectric layer 12 and semiconductor substrate 10. Because of a difference in the physical properties of a silicon substrate and a silicon dioxide layer, a tensile stress is exerted upon semiconductor substrate 10, while a compressive stress is exerted upon dielectric layer 12. The stress exerted upon semiconductor substrate 10 during the reoxidation process together with the diffusion of oxygen atoms into semiconductor substrate 10 creates numerous point defects, designated by "*" in FIG. 2.

As illustrated in FIG. 2, the induced stress from the substrate oxidization near gate electrode edges 24 and 26 causes an increase in the point defect population in substrate 10 near the edges of gate electrode 18. It is important to note that, as illustrated, a substantial majority of the point defect population resides near substrate surface 14 and within shallow doped region 16.

Although not wishing to have their invention limited to any particular theory, the inventors believe that the increased population of point defects near the edges of gate electrode 18 and channel region 20 create a diffusion pathway through which boron atoms in channel region 20 can diffuse. The localized diffusion of boron through the point defects near the edge of channel region 20 result in a change in the boron dopant concentration profile within channel region 20. The effect of the boron dopant distribution on the threshold voltage of an MOSFET device having a reduced channel length will subsequently be described.

Figure 3:
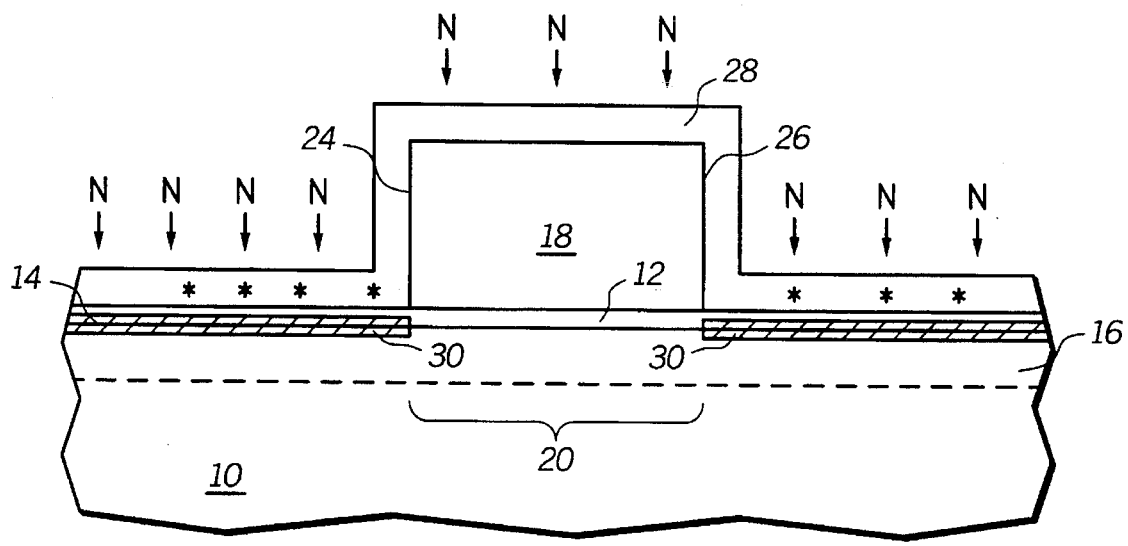

The inventive process continues with the formation of a buffer layer 28 to overlie gate electrode 18 and the exposed surface of gate dielectric layer 12, as illustrated in FIG. 3. Buffer layer 28 is deposited to conformally overlie the exposed surface of gate electrode 18 and dielectric layer 12. Buffer layer 28 is preferably a porous material having the capability to reduce stress in substrate 10, and having the ability to absorb point defects, such as interstitials, and the like. For simplicity of illustration, poly-reoxidation layer 22 is not shown in FIG. 3. Also, as previously described, the formation of poly-reoxidation layer 22 is an optional process of the present invention.

The process of the invention contemplates the diffusion of a defect compensating species through overlying layers and to the interface between dielectric layer 12 and substrate surface 14. The defect compensating species effectively reduces the defect population in the underlying substrate. The present invention contemplates any species capable of diffusing and piling up at a dielectric-silicon interface. Representative examples of such a species include nitrogen, nitrogen oxide, a halogenated compound, and elemental fluorine. For example, a halogen containing compound such as boron difluoride, or elemental fluorine, can be ion implanted into buffer layer 28 and diffused to the dielectric-silicon interface.

In one method of the present invention, buffer layer 28 is formed by the chemical vapor deposition of a layer of silicon dioxide. Preferably, buffer layer 28 is formed by a chemical vapor deposition process using tetraethylorthosilane (TEOS) source gas. The chemical vapor deposition process is carried out in a deposition furnace at about 600° to 700° C. to form a silicon dioxide layer having a thickness of about 100 to 200 angstroms.

Following the deposition of buffer layer 28, a densification process is carried out in a furnace at a temperature of about 800° to 1,000° C. in the presence of a nitrogen oxide compound. The nitrogen oxide compound can either be nitrous oxide ($N_2O$) or nitric oxide (NO). Preferably, the densification process is carried out in a nitrous oxide ambient at a temperature of about 900° to 950° C. for about 25 to 35 minutes. During the densification process, nitrogen from the nitrous oxide diffuses through buffer layer 28 and gate dielectric layer 12. Oxygen atoms from the decomposition of the nitrous oxide also diffused through buffer layer 28. The oxygen atoms react with the silicon in gate electrode 18. In an alternative process, buffer layer 28 can be densified in a rapid thermal annealing apparatus using a nitrous oxide or nitric oxide atmosphere at a temperature of about 950° to 1100° C. The rapid thermal annealing process is preferably carried out for about 20 to 60 seconds.

Because the chemical vapor deposited silicon dioxide compensates for the stress induced by dielectric layer 12, there is almost no stress at the interface between dielectric layer 12 and substrate 10. Accordingly, point defect generation at the interface during subsequent oxidation processes is minimized. Also, because of increased rate of oxygen diffusion through buffer layer 28, the corners of gate electrode 18 rapidly oxidize to form small oxidized regions at edges 24 and 26 overlying gate dielectric layer 12. This phenomenon is known as "poly bird's beak" formation. The oxidation of edges 24 and 26 rounds the sharp corners of gate electrode 18, and produces a locally-thick gate dielectric region at the edges of gate electrode 18. The formation of a poly bird's beak functions to reduce the electrical field at the gate edges thereby improving the performance of an MOSFET device fabricated in accordance with the present invention. It is important to note that poly-reoxidation layer 22, when used, also contributes to the formation of the poly bird's beak.

In a second method, buffer layer 28 is formed by the chemical vapor deposition of a layer of polycrystalline silicon. In this method, polycrystalline silicon is preferably deposited to a thickness of about 200 to 500 angstroms. After depositing the polycrystalline silicon, an oxidation process is carried out in the presence of a nitrogen oxide ambient. Preferably, either nitrous oxide or nitric oxide is introduced during the thermal oxidation process. The nitrogen oxide compound disassociates and nitrogen diffuses through the polycrystalline silicon and through gate dielectric layer 12 to form defect-compensating region 30. The disassociated oxygen simultaneously oxidizes the polycrystalline silicon layer converting it to silicon dioxide.

In an alternative to the second method, the polycrystalline silicon is first oxidized by introducing pure oxygen and converting the deposited polycrystalline silicon to a polyoxide. Then, a nitrogen oxide compound is introduced and nitrogen is diffused through the polyoxide and through gate dielectric layer 12 to form defect-compensating region 30.

Using either the first method or the second method, the process of the invention substantially reduces the point defect population in shallow doped region 16. Both methods form a poly bird's beak at the edges of gate electrode 18 overlying gate dielectric layer 12. Additionally, the diffusion of oxygen using either method is believed to enhance the transport of point defects from semiconductor substrate 10 and into buffer layer 28. As previously described, the reduction in point defect population near the edges of channel region 20 preserves the boron doping profile within the channel region.

The nitrogen diffusion process forms a defect-compensating region 30 residing at the interface between gate dielectric layer 12 and substrate surface 14. As illustrated in FIG. 3, the nitrogen diffusion process is carried out such that defect-compensating region 30 resides at substrate surface 14 adjacent to edges 24 and 26 of gate electrode 18. Defect-compensating region 30 alters the intrinsic characteristics of substrate surface 14. It is believed that nitrogen retards the amount of point defect generation during thermal oxidation steps performed during MOSFET device processing. In addition, because buffer layer 28 is formed by the deposition of a porous, silicon-deficient material, point defects near substrate surface 14 are absorbed into buffer layer 28 during the nitrogen diffusion process. The passivation of point defect defects by defect-compensating region 30, and the point defect absorptive characteristics of buffer layer 28 function to substantially reduce the point defect population in shallow doped region 16.

Figure 4:
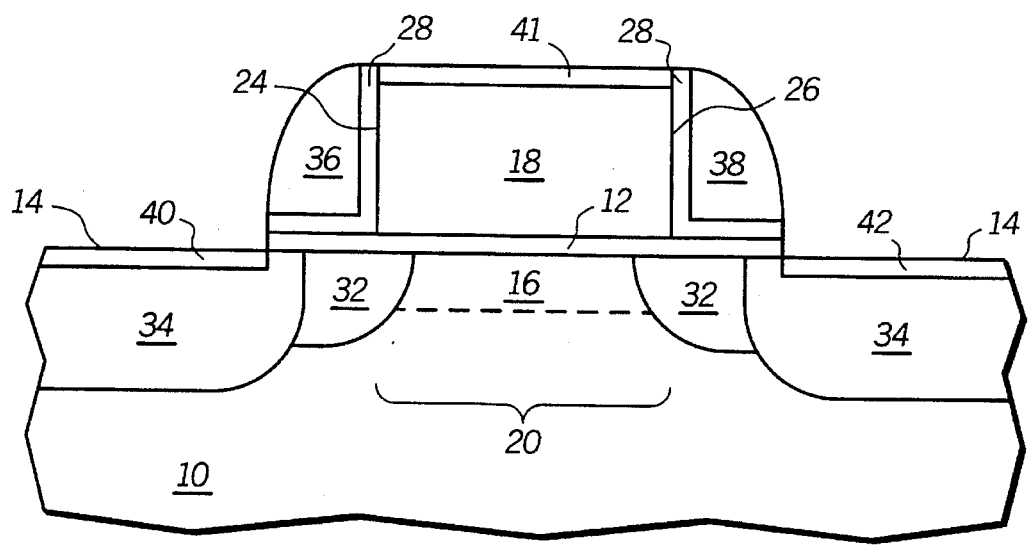

After forming defect-compensating region 30, processing steps are carried out to complete the fabrication of an MOSFET. As illustrated in FIG. 4, processing steps are carried out to form source-drain extension regions 32 and heavily doped source and drain regions 34 in substrate 10. Channel region 22 is bounded by source-drain extension regions 32 and provides a pathway for charges to flow when a positive voltage is applied to gate electrode 18.

Source-drain extension regions 32 are formed by the ion implantation of an n-type dopant such as Phosphorus or arsenic using gate electrode 18 as a doping mask. For example, arsenic is implanted with a dose of about 1.0E14 ion/cm$^2$. After forming source drain extension regions 32, sidewall spacers 36 and 38 are formed adjacent to gate edges 24 and 26, respectively. Sidewall spacers 36 and 38 are formed by the chemical vapor deposition of a layer of silicon nitride followed by an anisotropic etching. The etching process also removes portions of buffer layer 28 overlying gate electrode 18, and portions of buffer layer 28 overlying substrate 10 not protected by sidewall spacers 36 and 38.

After forming sidewall spacers 36 and 38, an ion implantation process is carried out to form heavily doped source drain regions 34. For example, arsenic is ion implanted using a dose of about 3.0E15 ion/cm$^2$ at an energy of about 50 to 90 keV. After heavily doped source drain regions 34 are formed, regions of gate dielectric layer 12 exposed by sidewall spacers 36 and 38 are removed. Then, refractory metal silicide regions 40, 41, and 42 are formed at substrate surface 14 on either side of gate electrode 18 and at the upper surface of gate electrode 18. Refractory metal silicide regions 40 and 42 are spaced apart from gate electrode 18 by sidewall spacers 36 and 38. The refractory metal silicide regions are preferably formed by the deposition of a layer of titanium followed by thermal processing to react the titanium with silicon at substrate surface 14.

It is important to note that in the processing steps described above, semiconductor substrate 10 is subjected to thermal processing steps both during the deposition of the silicon nitride and titanium layers, and during the annealing steps used to activate the dopant atoms implanted into semiconductor substrate 10. These processing steps can increase the population of point defects in semiconductor substrate 10, and in particular, in shallow doped region 16. However, nitrogen-rich regions 30 and buffer layer 28 function to control the increase in point defect population during the thermal processing steps. Accordingly, the doping concentration in shallow doped region 16 remains substantially uniform and does not undergo localized diffusion during thermal processing.

In addition to the effects of thermal processing, the formation of silicide regions 40 and 42 can also increase the population of point defects in semiconductor substrate 10. An additional advantage of the present invention includes the displacement of refractory metal silicide regions 40 and 42 away from channel region 20. The displacement results from the deposition of buffer layer 28 to a thickness of at least several hundred angstroms. Since buffer layer 28 separates sidewall spacers 36 and 38 from gate electrode 18, the deposited thickness of buffer layer 28 functions to laterally displace the sidewall spacers away from gate electrode 18. The lateral displacement caused by buffer layer 28, in turn, increases the separation distance of refractory metal silicide regions 40 and 42 from channel region 20. By increasing the separation distance, the effects of uncompensated point defects arising from the formation of refractory metal silicide regions 40 and 42 on channel region 22 is reduced. In addition, where buffer layer 28 is a chemical vapor deposited silicon dioxide, the stress between gate dielectric layer 12 and semiconductor substrate 10 is reduced, such that point defects arising from refractory metal silicide regions 40 and 42 are minimized.

Without further elaboration, it is believed that one skilled in the art can, using the preceding description, utilize the invention to its fullest extent. The following specific example is, therefore, to be construed as merely illustrative and not limiting of the remainder of the disclosure.

EXAMPLE

Several n-channel MOSFET devices were fabricated on a P-type silicon substrate. The devices were processed such that a series of transistors were fabricated having a nominal gate length ranging from 20 to 0.2 microns. The gate electrodes were fabricated by depositing 2500 angstroms of polycrystalline silicon onto a thermally grown gate oxide layer having a thickness of about 70 angstroms. The gate oxide layer was formed by a thermal oxidation process in dry oxygen at 800° C. Several substrates were prepared and split into three groups. A first group (Group I) was processed using a conventional thermal reoxidation process in which the gate electrodes were oxidized in oxygen at 830° C. A second group (Group II) was processed using a conventional nitrous oxide reoxidation process carried out at 900° C. A third group (Group III) was processed in accordance with the invention. The Group III devices were processed by chemical vapor depositing a 200 angstrom thick layer of silicon dioxide onto the gate electrodes and the gate oxide layer. The deposition process was carried out at 650° C. for about 20 minutes. Then, the deposited oxide was densified in a nitrous oxide ambient at 900° C. for about 28 minutes.

All three groups received identical processing following the reoxidation step used in the fabrication of Groups I and II, and the deposition and densification step used in Group III. Source-drain extension regions were formed by the ion implantation of arsenic using a dose of 5.0E14 ion/cm$^2$. Sidewall spacers were formed on the gate electrodes by the deposition and anisotropic etching of a silicon nitride layer. Heavily doped source and drain regions were formed by the ion implantation of arsenic using a dose of 3.0E15 ion/cm$^2$. Refractory metal silicide regions were formed by the deposition of titanium, followed by thermal processing at to form titanium silicide regions above the source and drain regions. Finally, processing was completed by depositing a thick inter-level-dielectric (ILD) layer over the devices and forming metal contacts to the source, drain, and gate regions.

Figure 5:
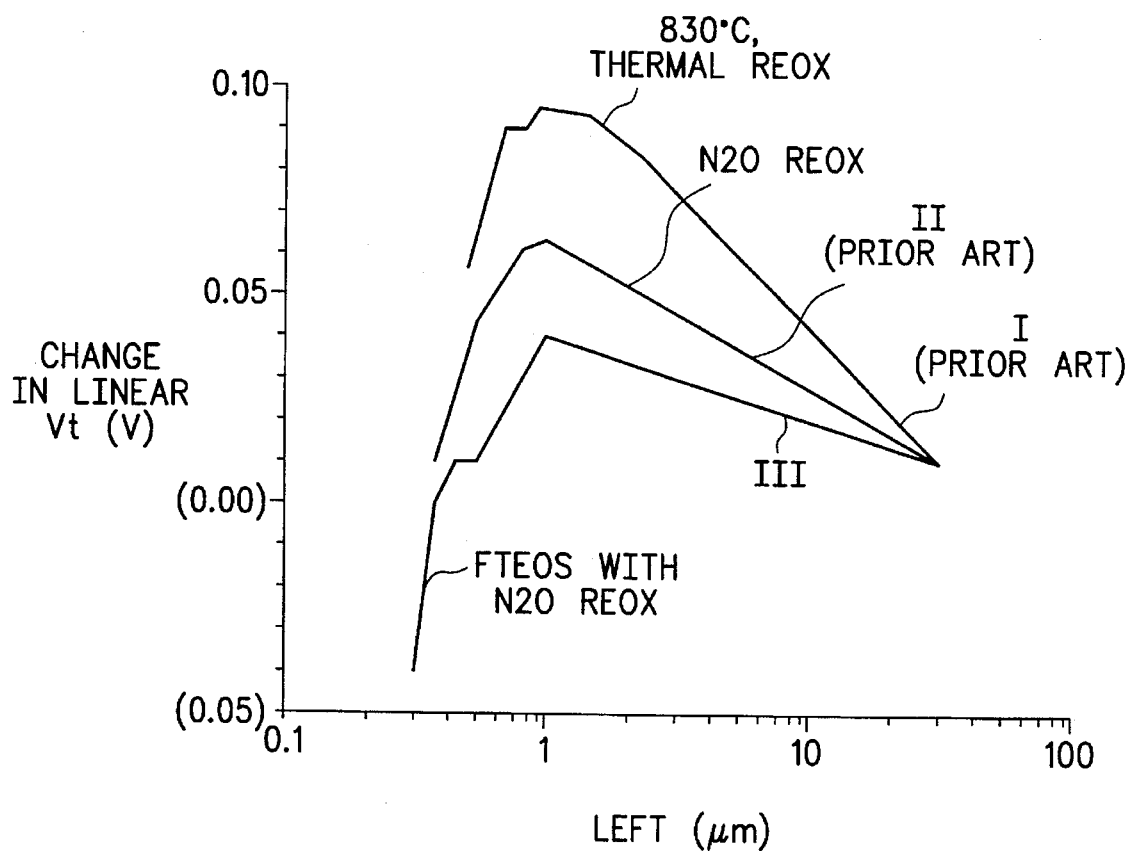
FIG. 5 is a plot of the change in threshold voltage as a function of the effective channel length for groups of transistor devices fabricated in accordance with the prior art and in accordance with the invention.

The change in threshold voltage as a function of the effective channel length of transistors fabricated in the three different groups is shown in FIG. 5. The change in threshold voltage in volts is plotted versus the effective channel length in microns for each of the three groups. The experimental results show that the transistors fabricated in accordance with the invention (Group III) exhibit a more constant threshold voltage as the effective channel length is reduced than is observed with either of the prior art processes used to fabricate samples in Groups I or Group II.

The reverse short channel effects are indicated by the rise in threshold voltage in all groups as the effective channel length become smaller. Although all three groups exhibit a reverse short channel effect, transistors processed in accordance with the invention show a reduced susceptibility to reverse short channel effects. The improvement is believed to relate to the reduction and control of the point defect population in the channel region of the devices fabricated in accordance with the invention.

Thus it is apparent that there has been provided, in accordance with the invention, a process for the fabrication of an MOSFET device having reduced short channel effects, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, processing techniques, such as UV and X-ray lithography, electron cyclotron resonance etching, cluster tool deposition and etching, and the like, can be used in the fabrication process. It is therefore intended to include within the invention all such variations and modifications as fall within the scope of the appended claims and equivalents thereof.

We claim:

1. A process for fabricating a semiconductor device comprising the steps of:
   providing a substrate having a gate dielectric layer thereon;
   forming a gate electrode on the gate dielectric layer;
   depositing a buffer layer to overlie the gate electrode and the gate dielectric layer;
   subjecting the substrate to a defect compensating species; and
   diffusing the defect compensating species through the buffer layer and the gate dielectric layer to form a defect-compensating regions between the substrate and the gate dielectric layer, and separated by the gate electrode.

2. The process of claim 1, wherein the step of depositing a buffer layer comprises depositing a material selected from the group consisting of silicon dioxide and polycrystalline silicon.

3. The process of claim 1, wherein the step of subjecting the substrate to a defect compensating species comprises subjecting the substrate to a species selected from the group consisting of a nitrogen oxide compound and a fluorine-containing compound.

4. The process of claim 1, wherein the step of depositing a buffer layer comprises depositing polycrystalline silicon.

5. The process of claim 4 further comprising the step of thermally oxidizing the polycrystalline silicon simultaneously with a step of subjecting the substrate to a nitrogen oxide compound.

6. A process for fabricating a semiconductor device comprising the steps of:
   providing a substrate having a gate dielectric layer overlying a surface thereof;
   forming a gate electrode on the gate dielectric layer having first and second edges and defining a channel region between the first and second edges;
   depositing a buffer layer to overlie the gate electrode and the gate dielectric layer;
   subjecting the substrate to a nitrogen oxide compound;
   diffusing nitrogen through the buffer layer and the gate dielectric layer to form nitrogen-rich regions between the substrate and the gate dielectric layer and separated by the channel region; and
   diffusing point defects from the substrate through the gate dielectric layer and into the buffer layer.

7. The process of claim 6, wherein the step of depositing a buffer layer comprises depositing a material selected from the group consisting of silicon dioxide and polycrystalline silicon.

8. The process of claim 6, wherein the step of depositing a buffer layer comprises chemical vapor deposition of silicon dioxide.

9. The process of claim 6, wherein the step of depositing a buffer layer comprises depositing polycrystalline silicon.

10. The process of claim 9 further comprising the step of thermally oxidizing the polycrystalline silicon simultaneously with the step of subjecting the substrate to a nitrogen oxide compound.

11. The process of claim 6 further comprising the steps of:
    forming insulating sidewall spacers adjacent to the first and second edges of the gate electrode and separated therefrom by the buffer layer; and
    forming silicide regions at the substrate surface, wherein the silicide regions are spaced apart from the channel region by the nitrogen-rich region.

12. A process for fabricating a semiconductor device comprising the steps of:
    providing a substrate having a gate dielectric layer overlying a surface thereof;
    doping the substrate with a conductivity determining dopant species;
    forming a gate electrode on the gate dielectric layer having first and second edges and defining a channel region between the first and second edges;
    depositing a buffer layer to overlie the gate electrode and the gate dielectric layer;
    subjecting the substrate to a nitrogen oxide compound;
    diffusing nitrogen through the buffer layer and the gate dielectric layer to form nitrogen-rich regions between the substrate and the gate dielectric layer and separated by the channel region; and
    applying thermal energy to the substrate,
    wherein point defects are formed in the substrate, and
    wherein the nitrogen-rich region reduces the concentration of point defects in the substrate and suppresses diffusion of dopant species into the channel region.

13. The process of claim 12, wherein the step of depositing a buffer layer comprises chemical vapor deposition of silicon dioxide to form a silicon dioxide layer having a thickness of 100 to 300 angstroms.

14. The process of claim 12, wherein the steps of subjecting the substrate nitrogen oxide compound and diffusing nitrogen comprise subjecting the substrate to one of nitrous oxide or nitric oxide at a temperature of 800° C. to 1000° C.

15. The process of claim 12, wherein the steps of subjecting the substrate to the nitrogen oxide compound and diffusing nitrogen comprise subjecting the substrate to one of nitrous oxide or nitric oxide at a temperature of 950° to 1100° C. for about 60 seconds.

16. A process for fabricating a semiconductor device comprising the steps of:
    providing a substrate having a gate dielectric layer overlying a surface thereof;
    doping the substrate with a conductivity determining dopant species;
    forming a gate electrode on the gate dielectric layer having first and second edges and defining a channel region between the first and second edges;
    depositing a polycrystalline silicon layer to overlie the gate electrode and the gate dielectric layer; and
    oxidizing the polycrystalline silicon layer in a nitrogen oxide compound and simultaneously diffusing nitrogen through the gate dielectric layer to form nitrogen-rich regions between the substrate and the gate dielectric layer and separated by the channel region.

17. The process of claim 16 further comprising the steps of:

doping the substrate with a second conductivity determining dopant species after forming the gate electrode; and applying thermal energy to the substrate, wherein the nitrogen-rich region suppresses the diffusion of the second conductivity determining dopant species into the channel region.

18. A process for fabricating a semiconductor device comprising the steps of:

providing a substrate having a gate dielectric layer thereon;

forming a gate electrode on the gate dielectric layer;

depositing a polycrystalline silicon layer to overlie the gate electrode and the gate dielectric layer;

oxidizing the polycrystalline silicon layer in an oxygen ambient to form an oxidized layer;

subjecting the substrate to a nitrogen oxide compound;

diffusing nitrogen through the oxidized layer and the gate dielectric layer to form nitrogen-rich regions between the substrate and the gate dielectric layer and separated by the channel region; and diffusing point defects from the substrate through the gate dielectric layer and into the oxidized layer.

19. The process of claim 18 further comprising the steps of:

doping the substrate with a conductivity determining dopant species; and applying thermal energy to the substrate, wherein the nitrogen-rich region suppresses diffusion of dopant species into the channel region.

* * * * *

UNITED STATES PATENT AND TRADEMARK OFFICE
CERTIFICATE OF CORRECTION

PATENT NO. : 5,552,332
DATED : September 3, 1996
INVENTOR(S) : Hsing-Huang Tseng, Philip J. Tobin, Paul G. Y. Tsui, Shih W. Sun, Stephen S. Poon It is certified that error appears in the above-indentified patent and that said Letters Patent is hereby corrected as shown below:

In claim 14, column 10, 41;
    before "nitrogen" insert --to a--.

Signed and Sealed this

Twenty-eighth Day of October, 1997

Attest:

BRUCE LEHMAN

*Attesting Officer*     *Commissioner of Patents and Trademarks*